(12) United States Patent
Choi et al.

(10) Patent No.: US 7,501,870 B2
(45) Date of Patent: Mar. 10, 2009

(54) DUTY CYCLE CORRECTION CIRCUIT AND DUTY CYCLE CORRECTION METHOD

(75) Inventors: Hyun Su Choi, Suwon-si (KR); Chan Kyung Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 27 days.

(21) Appl. No.: 11/819,414

(22) Filed: Jun. 27, 2007

(65) Prior Publication Data

US 2008/0024182 A1 Jan. 31, 2008

(30) Foreign Application Priority Data

Jul. 25, 2006 (KR) ...................... 10-2006-0069573

(51) Int. Cl.
*H03K 3/017* (2006.01)

(52) U.S. Cl. ...................... 327/175; 327/292

(58) Field of Classification Search ................ 327/175, 327/291–293, 295, 296
See application file for complete search history.

(56) References Cited

U.S. PATENT DOCUMENTS

| 5,572,158 | A * | 11/1996 | Lee et al. ............... 327/175 |
| 6,198,322 | B1 | 3/2001 | Yoshimura |
| 6,373,309 | B1 * | 4/2002 | Bang .................... 327/175 |
| 6,975,150 | B2 * | 12/2005 | Panikkath et al. .......... 327/175 |
| 7,015,739 | B2 * | 3/2006 | Lee et al. ................ 327/175 |
| 7,180,346 | B2 * | 2/2007 | Lee ...................... 327/175 |
| 7,199,634 | B2 * | 4/2007 | Cho et al. ............... 327/175 |
| 7,292,082 | B2 * | 11/2007 | Nam et al. ............... 327/175 |
| 2006/0028256 | A1 | 2/2006 | Nam et al. |

FOREIGN PATENT DOCUMENTS

| JP | 2000-068797 | 3/2000 |
| KR | 10-2002-0044191 | 6/2002 |
| KR | 10-2006-0013205 | 2/2006 |

* cited by examiner

*Primary Examiner*—Lincoln Donovan
*Assistant Examiner*—William Hernandez
(74) *Attorney, Agent, or Firm*—Lee & Morse, P.C.

(57) ABSTRACT

A duty cycle correction circuit may include an error corrector adapted to correct duty cycles of first differential analog clock signals input to a pair of input terminals based on duty cycle correction signals input to a pair of control terminals and to output second differential analog clock signals having corrected duty cycles through a pair of output terminals, an analog to digital buffer adapted to convert the second differential analog clock signals to differential digital clock signals, a duty error detector adapted to detect duty cycles of the differential digital clock signals and to output a N bit digital signal, and a duty error correction signal generator adapted to output differential control current signals having current gains controlled based on the second differential analog clock signals and the N bit digital signal to the pair of control terminals as the duty cycle correction signals.

8 Claims, 9 Drawing Sheets

DUTY CYCLE CORRECTION CIRCUIT AND DUTY CYCLE CORRECTION METHOD

BACKGROUND OF THE INVENTION

1. Field of the Invention

Embodiments of the present invention relate to a duty cycle correction circuit, and more particularly, to a duty cycle correction circuit adjusting current characteristic using a digital duty error detector and a method thereof.

2. Description of the Related Art

For systems that use a multi-phase clock signal, e.g., Double Data Rate Synchronous Dynamic Random Access Memory (DDR SDRAM), an analog to digital converter (ADC), etc., an analog duty cycle correction circuit may be used to maintain a constant, e.g., 50%, duty cycle (or duty rate).

Since the analog duty cycle correction circuit stores information on duty error, e.g., deviation from a desired duty cycle, in a capacitor, information on the duty error may be damaged by a leakage current of the capacitor when the analog duty cycle correction circuit is powered off in a power down mode to reduce power consumption. When the analog duty cycle correction circuit is driven into an active mode from a power down mode, settling time of the analog duty cycle correction circuit may be increased.

FIG. 1 illustrates a block diagram of a conventional duty cycle correction circuit. FIG. 2 illustrates a detailed circuit diagram of a duty cycle correction circuit illustrated in FIG. 1. Referring to FIGS. 1 and 2, a duty cycle correction circuit 10 may include a corrector 12 correcting a duty error and a detector 14 detecting a duty error. An analog offset voltage generated in the detector 14 may be stored in each capacitor 16 and 18, and an offset voltage stored in each capacitor 16 and 18 may correct duty errors of clock signals Ci and Cib by generating a current difference of a transistor for a correction.

Current gain of the detector 14 for each capacitor 16 and 18 in the duty cycle correction circuit 10 is an important design factor. Current gain may be increased to lessen settling time, but this increase may provoke an error for duty cycle correction after settling time. Thus, there is a trade-off relation between settling time and accuracy of duty error correction.

Because accuracy and power consumption for duty cycle are very important design specifications in high speed devices, i.e., device that use a multi-phase clock signal, when an analog duty cycle correction circuit is turned off in a power down mode, information is stored in a capacitor having a much bigger capacity than current gain. Accordingly, when restored to active mode, a conventional analog duty cycle correction circuit has long settling time before a duty cycle may be corrected to the desired, e.g., 50%, duty cycle.

SUMMARY OF THE INVENTION

Embodiments of the present invention are therefore directed to a duty cycle correction circuit detector and a method thereof, which substantially overcomes one or more of the problems due to the limitations and disadvantages of the related art.

It is therefore a feature of an embodiment of the present invention to provide a duty cycle correction circuit and method thereof having high accuracy.

It is therefore another feature of an embodiment of the present invention to provide a duty cycle correction circuit and method thereof having a reduced settling time.

It is therefore yet another feature of an embodiment of the present invention to provide a duty cycle correction circuit and method thereof using a digital duty error detector.

At least one of the above and other features and advantages of the present invention may be realized by providing a duty cycle correction circuit, including an error corrector, an analog to digital buffer, a duty error detector, and a duty error correction signal generator. The error corrector may correct duty cycles of first differential analog clock signals input to a pair of input terminals based on duty cycle correction signals input to a pair of control terminals, and may output second differential analog clock signals which duty cycles are corrected through a pair of output terminals.

The analog to digital buffer may convert the second differential analog clock signals to differential digital clock signals. The duty error detector may receive the differential digital clock signals, detect duty cycles of the received differential digital clock signals, and output a N-bit digital signal based on a result of detection. The duty error correction signal generator may output the second differential analog clock signals and differential control current signals having current gains controlled in accordance with the N-bit digital signal, to the pair of control terminals as the duty cycle correction signals.

The duty cycle correction circuit may include a first capacitor connected to one of the pair of input terminals and to a ground terminal, and a second capacitor connected to another of the pair of input terminals and the ground terminal.

The duty error detector may include a first delay circuit adapted to receive a first digital clock signal among the differential digital clock signals and output a plurality of first delay digital clock signals respectively having a different phase, a second delay circuit adapted to receive a second digital clock signal among the differential digital clock signals and output a plurality of second delay digital clock signals respectively having a different phase, and N unit cells.

An $i^{th}$ unit cell, where i is more than 1 and less than or equal to n, among the n unit cells may include a first to a fourth transistors connected in series between a first terminal receiving a first power, a second terminal receiving a second power, a fifth to an eighth transistors connected in series between the first terminal and the second terminal, and a signal generator outputting an 1 bit digital signal, which forms part of the N bit digital signal based on a signal of a first common node between the first transistor and the second transistor and a signal of a second common node between the fifth transistor and the sixth transistor.

Each gate of the first transistor and the fifth transistor may receive a reset signal, a gate of the second transistor may receive the first digital clock signal, a gate of the third transistor may receive a corresponding delay digital clock signal among the plurality of first delay digital clock signals, a gate of the fourth transistor may receive a first signal output from a $(i-1)^{th}$ unit cell, a gate of the sixth transistor may receive the second digital clock signal, a gate of the seventh transistor may receive a corresponding delay digital clock signal among the plurality of second delay digital clock signals, and a gate of the eighth transistor may receive a second signal output from the $(i-1)^{th}$ unit cell.

The signal generator may include a first latch adapted to latch a signal of the first common node, a second latch adapted to latch a signal of the second common node, an exclusive OR circuit performing exclusive OR after receiving an output signal of the first latch and an output signal of the second latch, a transmission circuit adapted to transmit an output signal of the exclusive OR circuit in response to a transmission control signal, and a third latch adapted to latch an output signal of the transmission circuit and outputting the 1 bit digital signal.

The duty error correction signal generator may include N binary-weighted transistors, a differential amplifier adapted to output the differential control current signals by amplifying a difference between the second differential analog clock signals, and wherein each 1 bit digital signal forming the N bit digital signal may be input to each gate of the N transistors.

The duty error correction signal generator may N thermometer-coded transistors, a differential amplifier adapted to output the differential control current signals by amplifying a difference between the second differential analog clock signals, and wherein each 1 bit digital signal composing the N bit digital signal may be input to each gate of the N transistors.

At least one of the above and other features and advantages of the present invention may be realized by providing a duty cycle correction method, including correcting duty cycles of first differential analog clock signals based on duty cycle correction signals and outputting second differential analog clock signals having corrected duty cycles, converting the second differential analog clock signals to differential digital clock signals, receiving the differential digital clock signals, detecting duty cycles of the received differential digital clock signals, and outputting a N bit digital signal based on a result of detection, and outputting differential control current signals having current gains controlled based on the second differential analog clock signals and the N bit digital signal as the duty cycle correction signals.

BRIEF DESCRIPTION OF THE DRAWINGS

The above and other features and advantages of the present inventive will become more apparent to those of ordinary skill in the art by describing in detail exemplary embodiments thereof with reference to the attached drawings, in which.

DETAILED DESCRIPTION OF THE INVENTION

Figure 1:
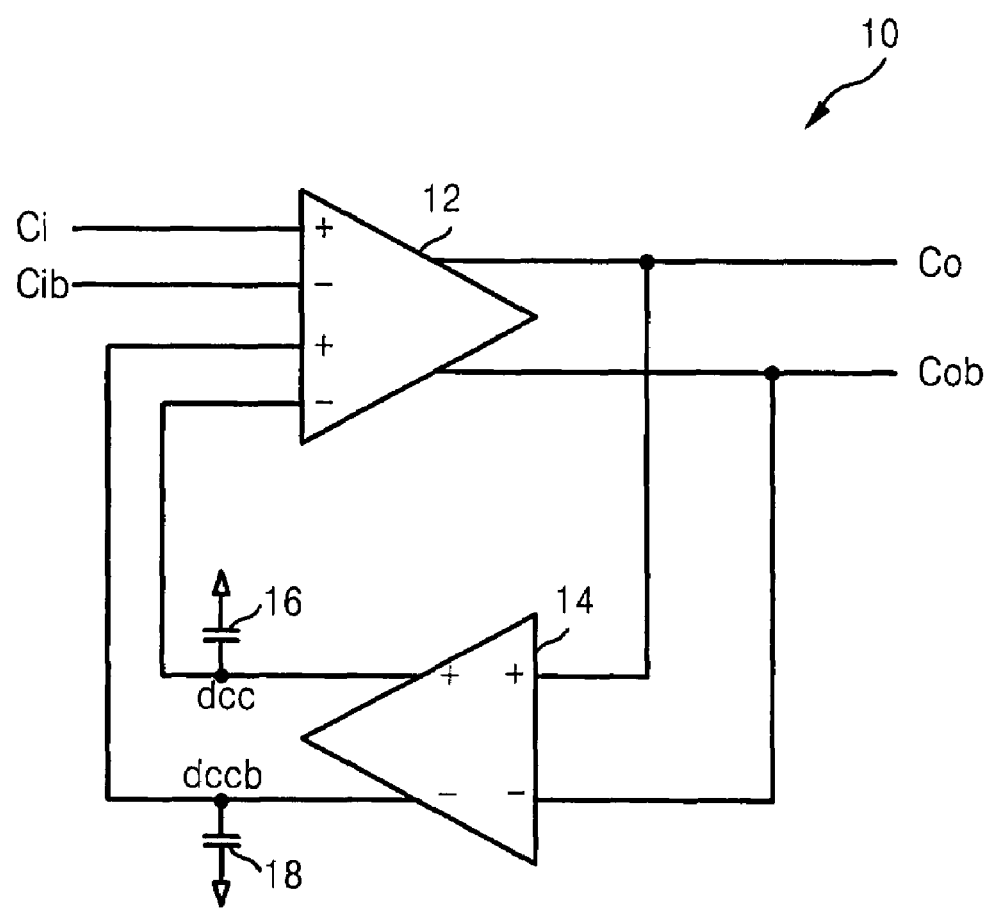
FIG. 1 illustrates a block diagram of a conventional duty cycle correction circuit.
Figure 2:
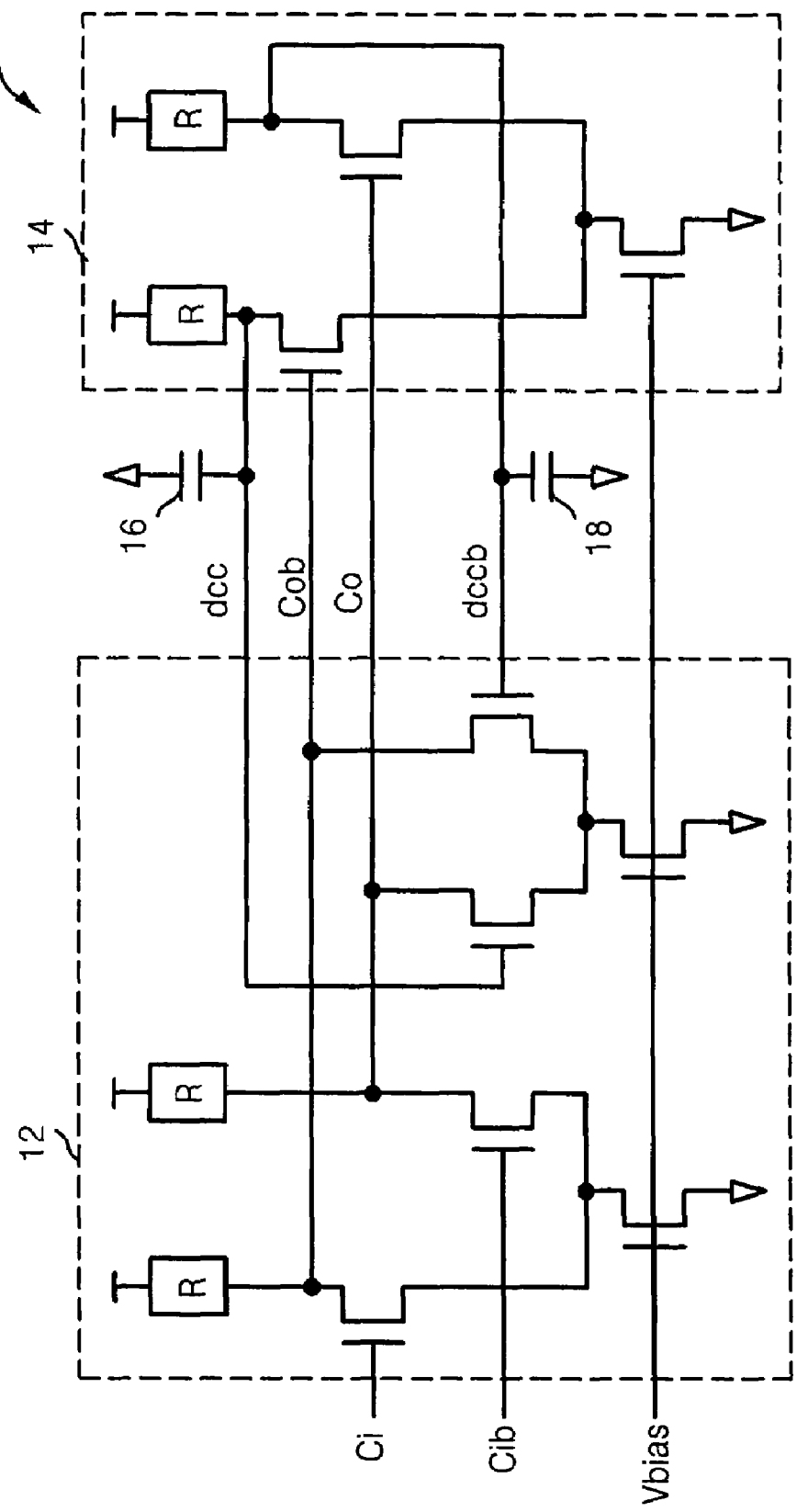
FIG. 2 illustrates a detailed circuit diagram of a duty cycle correction circuit illustrated in FIG. 1.

Korean Patent Application No. 10-2006-0069573, filed on Jul. 25, 2006, in the Korean Intellectual Property Office, and entitled: "Duty Cycle Correction Circuit and Duty Cycle Correction Method," is incorporated by reference in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

Figure 3:
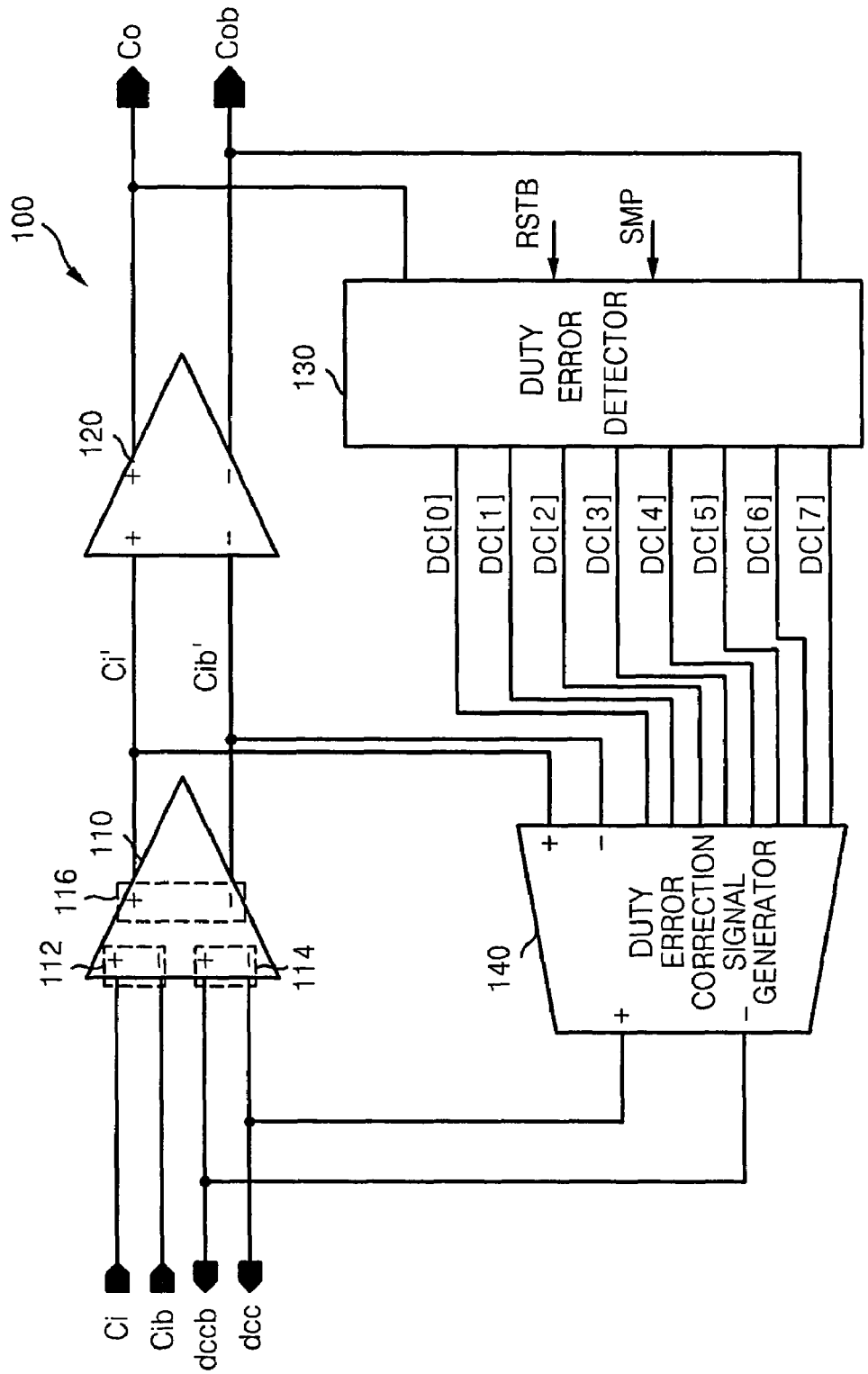
FIG. 3 illustrates a block diagram of a duty cycle correction circuit according to an example embodiment of the present invention.

FIG. 3 illlustrates a block diagram of a duty cycle correction circuit according to an example embodiment of the present invention. Referring to FIG. 3, the duty cycle correction circuit 100 may include an error corrector 110, an analog to digital buffer 120, a duty error detector 130, and a duty error correction signal generator 140.

The error corrector 110 may correct duty cycles of first differential analog clock signals Ci and Cib input to a pair of input terminals 112 based on duty cycle correction signals dcc and dccb input to a pair of control terminals 114, and may output second differential clock signals Ci' and Cib' having corrected duty cycles through a pair of output terminals 116. Duty cycle correction signals dcc and dccb may be differential signals.

The analog to digital buffer 120 may receive the second differential analog clock signals Ci' and Cib' output from the error corrector 110, and may output them as differential digital clock signals Co and Cob.

The duty error detector 130 may receive a plurality of control signals RSTB and SMP and differential digital clock signals Co and Cob, detect duty-cycles or duty errors of received differential digital clock signals Co and Cob, and output N-bit digital signals DC[N−1:0], where N is a natural number, based on a result of detection. The present description assumes that N is equal to 8 for ease of explanation.

The duty error correction signal generator 140 may output differential control current signals, and current gains may be controlled based on the second differential analog clock signals Ci' and Cib' output from the error corrector 110 and the 8 bit digital signals DC[7:0], to a pair of control terminal 114 as duty error correction signals dcc and dccb.

When a duty cycle correction circuit 100 of an embodiment of the present invention is driven into an active mode from a power down mode, a duty error detector 130 controls a duty error correction signal generator 140 to have high current gain in proportion to a duty error during settling time, and controls the duty error correction signal generator 140 to have low current gain after the settle time to improve accuracy.

Figure 4:
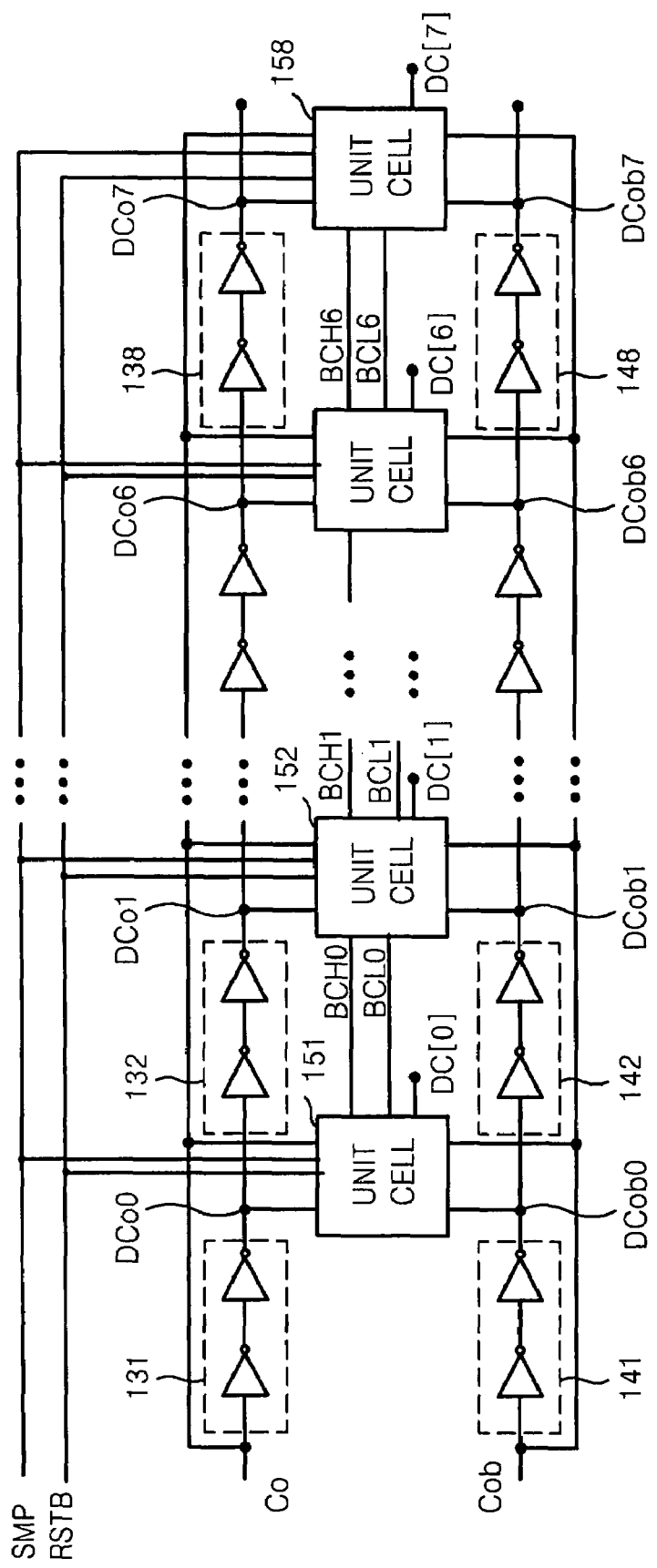
FIG. 4 illustrates a circuit diagram of a duty error detector illustrated in FIG. 3.

FIG. 4 is a circuit diagram of a duty error detector illustrated in FIG. 3. Referring to FIG. 4, the duty error detector 130 includes a first delay circuit, a second delay circuit, and N unit cells 151, 152, . . . , 158, where N is a natural number, e.g., 8.

The first delay circuit may include a plurality of buffers 131, 132, . . . , 138 connected in series. Each of the plurality of buffers 131, 132, . . . , 138 may respectively include M inverters connected in series, where M is a natural number, e.g., 2. The first delay circuit may receive a first digital clock signal Co of the differential digital clock signals Co and Cob, and may output a plurality of first delay digital clock signals DCo0, DCo1 . . . DCo7, which respectively have different phases.

The second delay circuit may include a plurality of buffers 141, 142, . . . , 148, which are connected in series. The plurality of buffers, 141, 142, . . . 148, may respectively includes M inverters connected in series, where M is a natural number, e.g., 2. The second delay circuit may receive a second digital clock signal Cob of differential digital clock signals Co and Cob, and may output a plurality of second delay digital clocks signals DCob0, DCob1, ..., DCob7, which respectively have different phases.

N unit cells 151, 152, ..., 158 may respectively output a corresponding digital signal DC[0] to DC[7] in response to the first digital clock signal Co, the second digital clock signal Cob, a respective first delay digital clock signal DCo0 to DCo7, output from a corresponding buffer 131, 132, ..., 138, a respective second digital clock signal DCob0 to DCob7, output from a corresponding buffer 141, 142, ..., 148, control signals RSTB and SMP, and signals BCHi and BCLi output from a prior cell, where 0≦i≦N−2.

Figure 5:
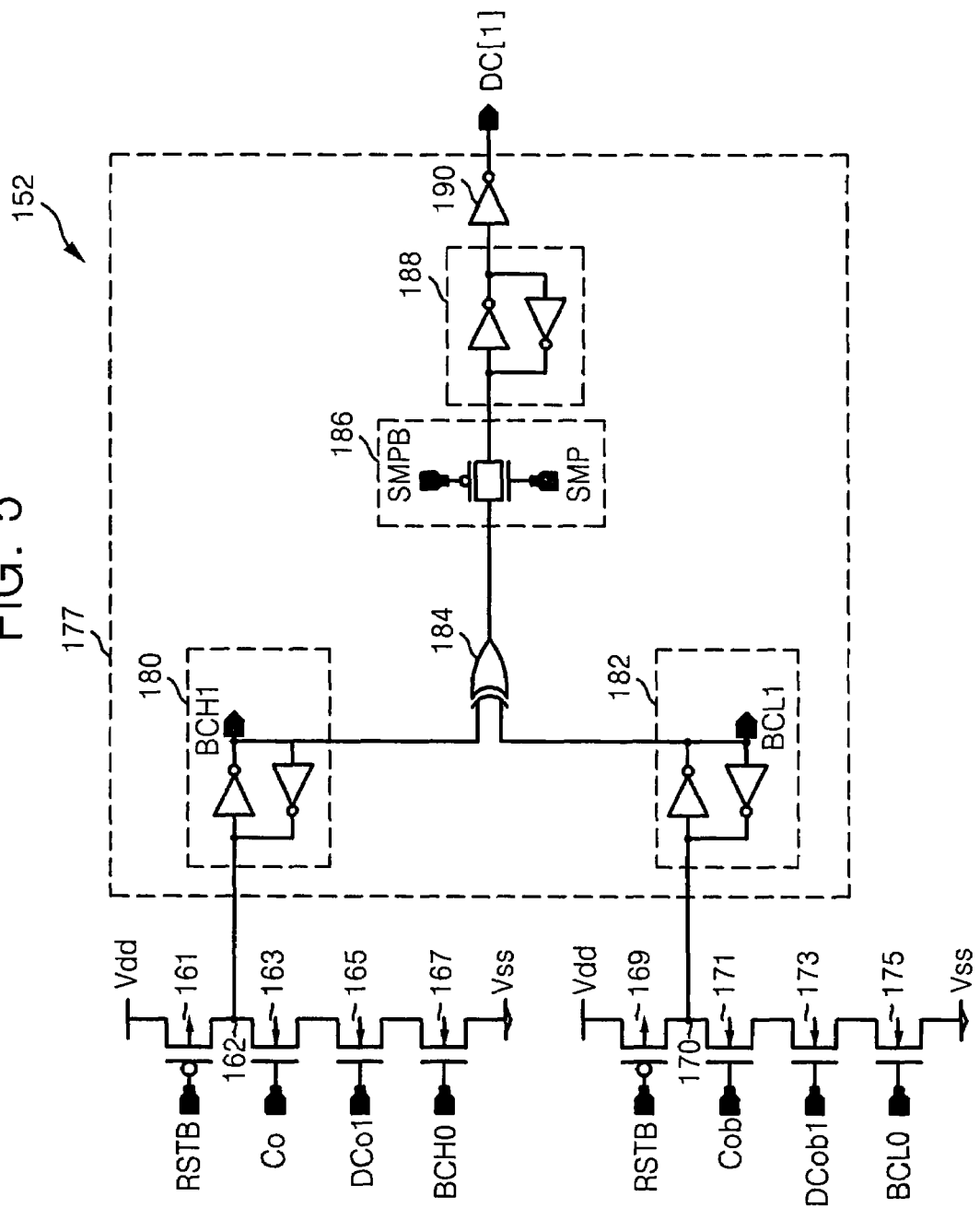
FIG. 5 illustrates a circuit diagram of a unit cell illustrated in FIG. 4.

FIG. 5 illustrates a circuit diagram of a unit cell of FIG. 4. Each unit cell 151, 152, ..., 158 substantially has the same or a similar structure, so only a circuit diagram of second unit cell 152 is illustrated and explained in FIG. 5. The second unit cell 152 may include first to fourth transistors 161, 163, 165, and 167 connected in series between a first terminal receiving a first voltage Vdd and a second terminal receiving a second voltage Vss, fifth to eighth transistors 169, 171, 173, and 175 connected in series between the first terminal and the second terminal, and a signal generator 177.

The signal generator 177 may output a 1 bit digital signal DC[1], which is part of the N bit digital code DC[7:0], based on a signal of a first common node 162 of the first transistor 161 and the second transistor, and a signal of a second common node 170 of the fifth transistor 169 and the sixth transistor 171.

The first transistor 161 and the fifth transistor 169 may be respectively embodied as a PMOS transistor, and a gate of each transistor 161 and 169 may receive a reset signal RSTB. A gate of the second transistor 163 may receive the first digital clock signal Co, a gate of the third transistor 165 may receives the delay digital clock signal DCo1, and a gate of the fourth transistor 167 may receive a first signal BCH0 output from the unit cell 151. A gate of the sixth transistor 171 may receive the second digital clock signal Cob, a gate of the seventh transistor 173 may receive the delay digital clock signal DCob1, and a gate of the eighth transistor 175 may receive a second signal BCL0 output from the unit cell 151.

Each gate of the fourth transistor and the eighth transistor of a first cell 151 may be connected to a first terminal receiving a first voltage Vdd. In addition, the first cell 151 may include transistors 161, 163, 165, 171, 173, and 175 connected in series between the first terminal and the second terminal.

The signal generator 177 may include a first latch 180, a second latch 182, an exclusive-OR circuit 184, a transmission circuit 186, and a third latch 188. The signal generator 177 may further include an inverter 190 inverting an output signal of the third latch 188.

The first latch 180 may receive and invert a signal of a first common node 162 and latches an inverted signal. An output signal BCH1 of the first latch 180 may be input to a fourth transistor of a next unit cell. The second latch 182 may receive and invert a signal of a second common node 170, and may latch an inverted signal. An output signal BCL1 of the second latch 182 may be input to an eighth transistor of a next unit cell.

The exclusive-OR circuit 184 may perform exclusive OR after receiving an output signal BCH1 of the first latch 180 and an output signal BCL1 of the second latch 182. The transmission circuit 186 may transmit an output signal of the exclusive OR circuit 184 to the third latch 188 in response to transmission control signals SMP and SMPB. The transmission circuit 186 may be embodied as a transmission gate, and transmission control signals SMP and SMPB may be differential signals or complementary signals.

The third latch 188 may receive and invert an output signal of the transmission circuit 186, latch an inverted signal, and output 1 bit digital signal DC[1]. If the inverter 190 is connected to an output terminal of the third latch 188, the inverter 190 may invert an output signal of the third latch 188 and output 1 bit digital signal DC[1].

Figure 6:
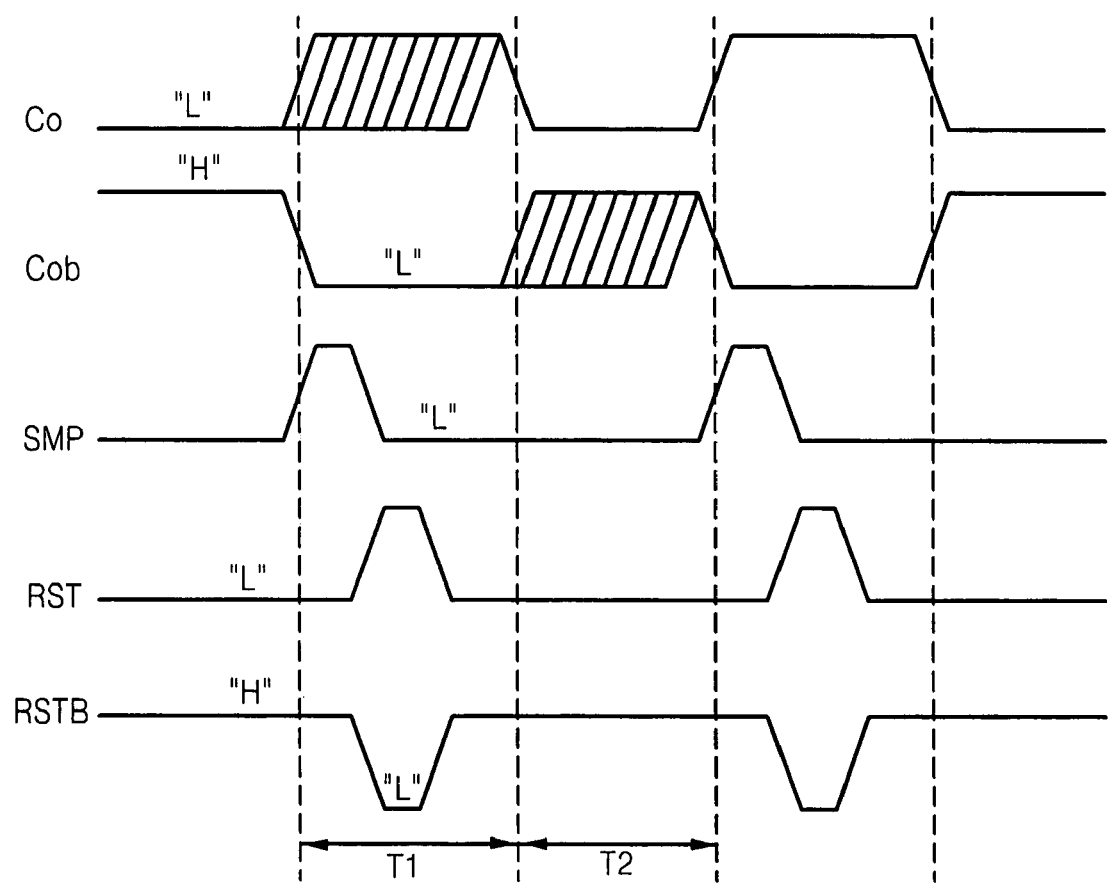
FIG. 6 is a timing diagram of a unit cell illustrated in FIG. 5.

FIG. 6 illustrates a timing diagram of a unit cell illustrated in FIG. 5. Referring to FIGS. 5 and 6, during a first time period T1, delay of the first digital signal Co may be determined by the first latch 180 and information on a duty cycle of the first digital signal Co may be stored in the first latch 180. During a second time period T2, delay of the second digital signal Cob may be determined by the second latch 182 and information on a duty cycle of the second digital signal Cob may be stored in the second latch 182. In every cycle where the transmission control signal SMP generated based on the first digital signal Co is high, an output of the exclusive OR circuit 184 may be stored in the third latch 188.

The first latch 180 and a second latch 182 may be reset by the reset signal RSTB following the transmission control signal SMP. The N-bit digital signal DC[N−1:0] generated by a duty error may properly control current gain of the duty error correction signal generator 140.

Referring to FIGS. 3 to 6, a first unit cell 151 may output BCHO, BCLO, and a least significant bit (LSB) of N-bit digital signals DC[N−1:0], i.e., DC[0], in response to the first digital clock signal Co, the second digital clock signal Cob, delay digital clock signals DCo0 and Dcob0, the reset signal RSTB, and the transmission control signal SMP.

The seventh unit cell 157 may output BCH6, BCL6, and DC[6] among N-bit digital signals DC[7:0] in response to the first digital clock signal Co, the second digital clock signal Cob, delay digital clock signals DCo6 and DCob6, the reset signal RSTB, and the transmission control signal SMP. In addition, the eighth unit cell 158 may output a most significant bit (MSB) among N-bit digital signal DC[7:0], i.e., DC[7], in response to the first digital clock signal Co, the second digital clock signal Cob, the delay digital clock signals DCo7 and DCob7, the reset signal RSTB, and the transmission control signal SMP.

Figure 7:
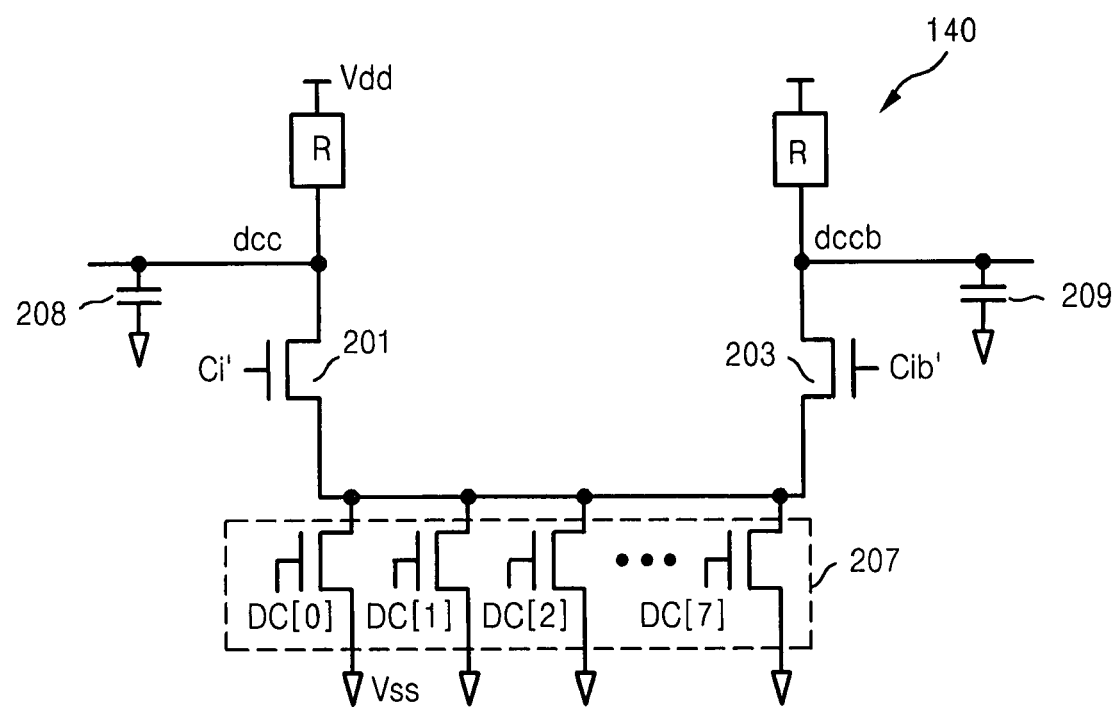
FIG. 7 illustrates a circuit diagram of a duty error correction signal generator illustrated in FIG. 3.

FIG. 7 illustrates a circuit diagram of a duty error correction signal generator 140 of FIG. 3. Referring to FIG. 7, the duty error correction signal generator 140 may be embodied as a differential amplifier including a pair of differential transistor 201 and 203, and a plurality of current sources 207. The duty error correction signal generator 140 illustrated in FIG. 7 may also be referred to as an adaptive current-steering pump.

The N-bit digital signal DC[N−1:0] may be input to each control terminal, i.e., each gate, of N current sources 207, which may be binary-weighted or thermometer-coded. Table 1 shows current strength for each digital signal. Here, BW is a current strength flowing in each binary-weighted current sources 207, and TMC is current strength flowing in each thermometer-coded current sources 207. That is, channel length-vs-channel width ratio of each transistor, which responds to a corresponding bit among N bit digital signals DC[N−1:0], may be the same, e.g., thermometer-coded, or may differ. Also, each transistor may be embodied as a current mirror form.

TABLE 1

|     | DC[0] | DC[1] | DC[2] | DC[3] | DC[4] | DC[5] | DC[6] | DC[7] |
| --- | --- | --- | --- | --- | --- | --- | --- | --- |
| BW  | 4     | 2     |       |       |       |       | 2     | 4     |
| TMC | 1     | 1     | 1     | 1     | 1     | 1     | 1     | 1     |

When an operational frequency is well defined, using binary-weighted current sources may be preferable. When an accurate operational frequency is not well-defined, as a delay in reaching a 50% duty ratio may be changed, using thermometer-coded current sources may be preferable.

The duty error correction signal generator 140 may output differential control current signals dcc and dccb, each current gain of which may be controlled based on the N-bit digital signal DC[N−1:0] and a second differential analog clock signals Ci' and Cib' output from the error corrector 110, to the pair of control terminals 114 of the error corrector 110. Each capacitor 208 and 209 may be respectively connected between the output terminals and a ground terminal.

Figure 8:
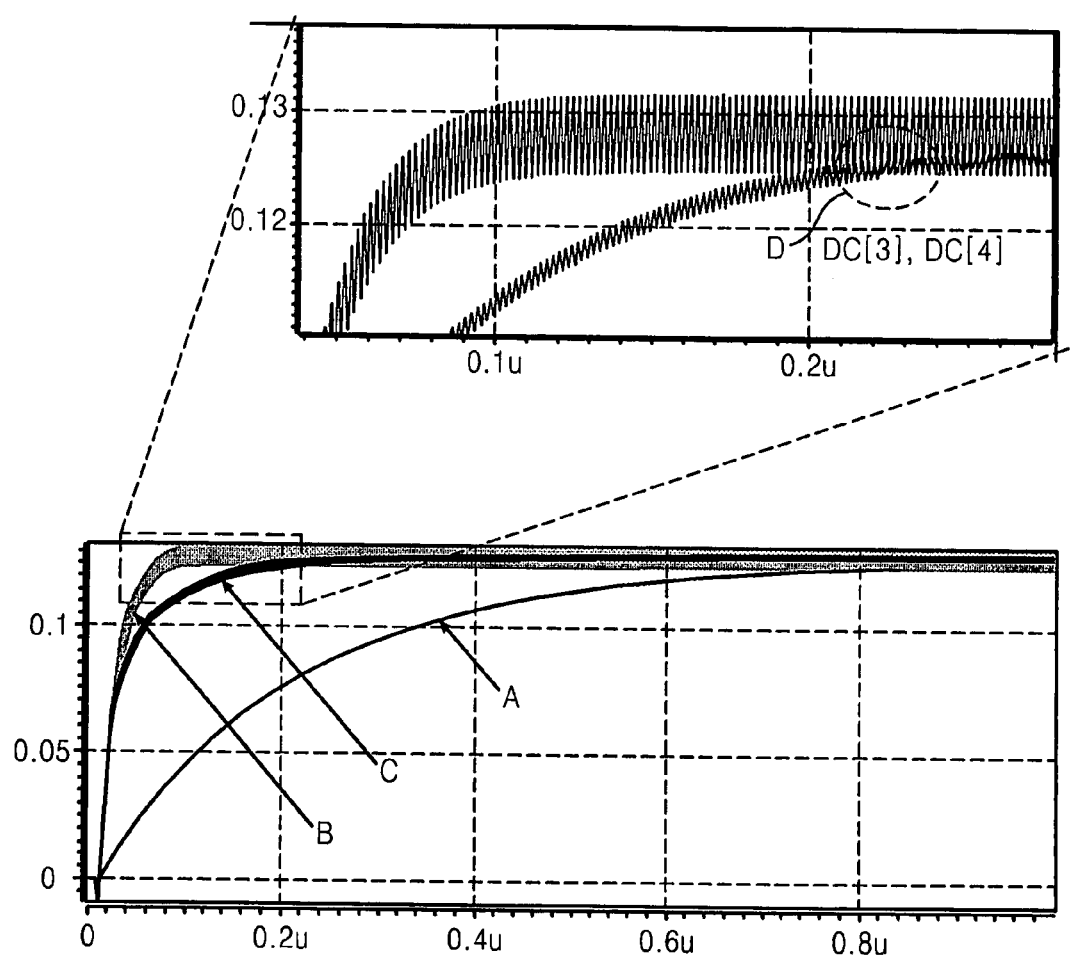
FIG. 8 illustrates a result of a settling time simulation.

FIG. 8 displays a result of simulation on settling time. Referring to FIG. 8, "A" is a settling time of an analog duty cycle correction circuit having a general current gain at an operational frequency of 500 MHz, "B" is a settling time of an general analog duty cycle correction circuit having maximum current gain at an operational frequency of 500 MHz, and "C" is a settling time of a duty cycle correction circuit at an operational frequency of 500 MHz according to an example embodiment of the present invention.

Comparing A and B, the general analog duty cycle correction circuit having the maximum current gain has about 90% improved settling time over the analog duty cycle correction circuit, having a settling time designed for 12 μs and a general current gain. However, it has sixteen times as much jitter compared to an analog duty cycle correction circuit having a general current gain. In other words, an analog duty cycle correction circuit having general current gain or a general analog duty cycle correction circuit having the maximum current gain has trade-offs between settling time and accuracy due to fixed current gain.

However, a duty cycle correction circuit of the present invention has sixteen times more current gain than a conventional analog duty cycle correction circuit in a beginning section of correction where a duty error is big, as illustrated in FIG. 8. Thus, duty error may be corrected more quickly. Current gain decreases as duty error decreases. For example, as illustrated in "D", the duty cycle correction circuit 100 of an embodiment of the present invention may control each digital signal DC[3] and DC[4] to have high level when a duty error is large, and may control each digital signal DC[3] and DC[4] to have a low level when a duty error is small.

Accordingly, comparing A and C in FIG. 8, a duty cycle correction circuit according to an embodiment of the present invention may provide the same accuracy as a conventional analog duty cycle correction circuit and a settling time improved by about 70% to 80%.

Figure 9:
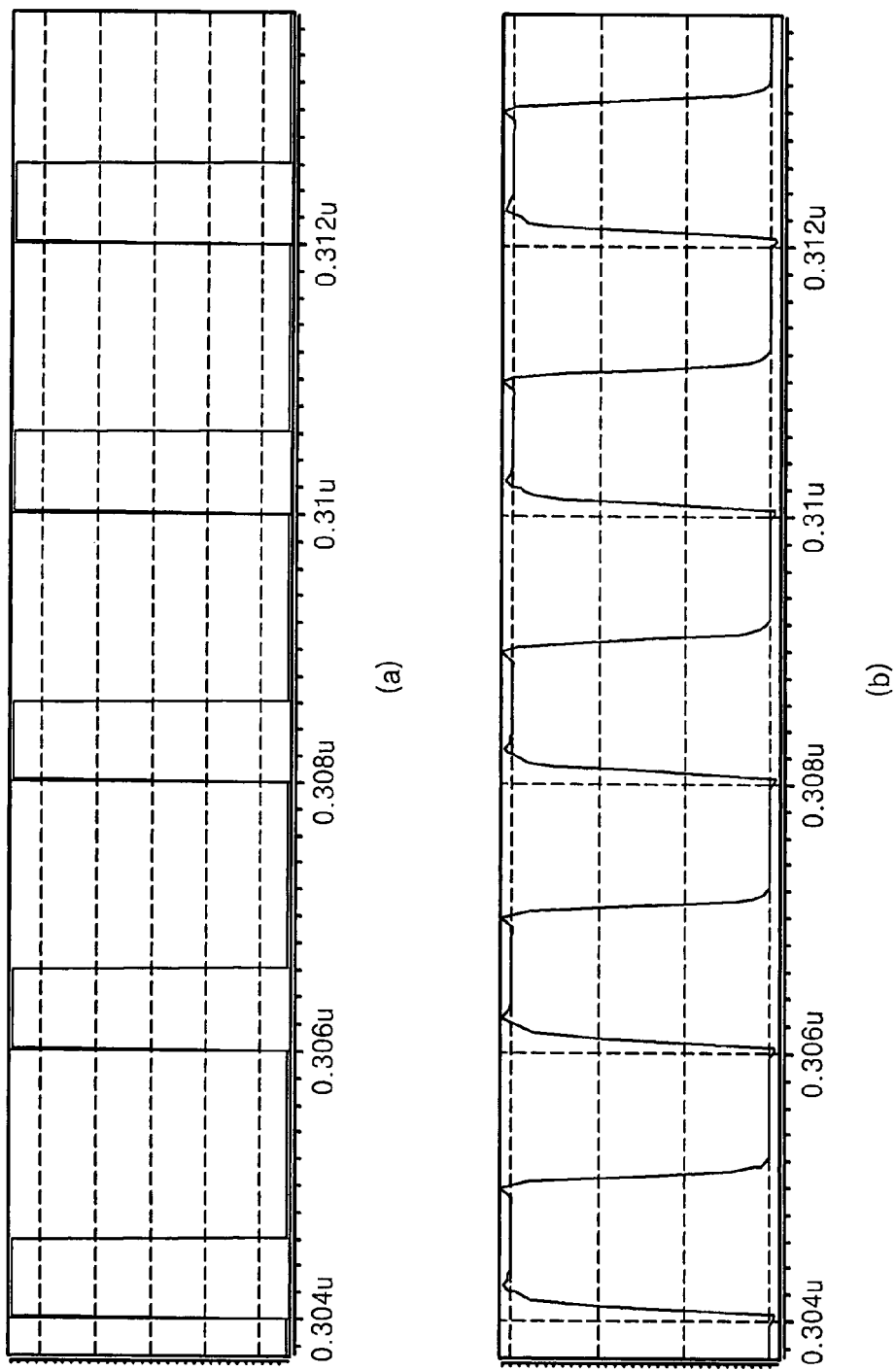
FIG. 9 illustrates a waveform of input/output clock signals of a duty cycle correction circuit according to another example embodiment of the present invention.

FIG. 9(a) illustrates a waveform of an analog input clock signal having a 3:7 duty cycle and FIG. 9(b) illustrates a waveform of a digital output clock signal of a duty cycle correction circuit according to an example embodiment of the present invention.

As described above, a duty cycle correction circuit according to an embodiment of the present invention may reduce settling time while having the same accuracy as a conventional analog duty cycle correction circuit.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A duty cycle correction circuit, comprising:
   an error corrector adapted to correct duty cycles of first differential analog clock signals input to a pair of input terminals based on duty cycle correction signals input to a pair of control terminals and to output second differential analog clock signals having corrected duty cycles through a pair of output terminals;
   an analog to digital buffer adapted to convert the second differential analog clock signals to differential digital clock signals;
   a duty error detector adapted to detect duty cycles of the differential digital clock signals and to output a N bit digital signal; and
   a duty error correction signal generator adapted to output differential control current signals having current gains controlled based on the second differential analog clock signals and the N bit digital signal to the pair of control terminals as the duty cycle correction signals.

2. The duty cycle correction circuit as claimed in claim 1, further comprising:
   a first capacitor connected to one of the pair of input terminals and a ground terminal; and
   a second capacitor connected to another one of the pair of input terminals and the ground terminal.

3. The duty cycle correction circuit as claimed in claim 1, wherein the duty error detector comprises:
   a first delay circuit adapted to receive a first digital clock signal among the differential digital clock signals and to output a plurality of first delay digital clock signals each having a different phase;
   a second delay circuit adapted to receive a second digital clock signal among the differential digital clock signals and to output a plurality of second delay digital clock signals each having a different phase; and
   N unit cells,
   wherein an $i^{th}$ unit cell, where i is more than 1 and less than or equal to N, among the N unit cells includes:
   first to fourth transistors connected in series between a first terminal receiving a first voltage and a second terminal receiving a second voltage;
   fifth to eighth transistors connected in series between the first terminal and the second terminal; and
   a signal generator adapted to output a 1 bit digital signal, which forms the N bit digital signal, based on a signal at a first common node between the first transistor and the second transistor and a signal at a second common node between the fifth transistor and the sixth transistor, wherein each gate of the first transistor and the fifth transistor receives a reset signal, a gate of the second transistor receives the first digital clock signal, a gate of the third transistor receives a corresponding delay digital clock signal among the plurality of first delay digital clock signals, a gate of the fourth transistor receives a first signal output from a $(i-1)^{th}$ unit cell, a gate of the sixth transistor receives the second digital clock signal, a gate of the seventh transistor receives a corresponding delay digital clock signal among the plurality of second delay digital clock signals, and a gate of the eighth transistor receives a second signal output from the $(i-1)^{th}$ unit cell.

4. The duty cycle correction circuit as claimed in claim 3, wherein the signal generator comprises:
   a first latch adapted to latch the signal of the first common node;
   a second latch adapted to latch the signal of the second common node;
   an exclusive OR circuit adapted to perform exclusive OR of an output signal of the first latch and an output signal of the second latch;
   a transmission circuit adapted to transmit an output signal of the exclusive OR circuit in response to a transmission control signal; and
   a third latch adapted to output the 1 bit digital signal by latching an output signal of the transmission circuit.

5. The duty cycle correction circuit as claimed in claim 4, wherein the signal generator further comprises an inverter adapted to receive the 1 bit signal output from the third latch.

6. The duty cycle correction circuit as claimed in claim 1, wherein the duty error correction signal generator comprises:
   a differential amplifier including N binary-weighted transistors and adapted to output the differential control current signals after amplifying a difference between the second differential analog clock signals,
   wherein each 1 bit digital signal forming the N bit digital signal is input to each gate of the N transistors.

7. The duty cycle correction circuit as claimed in claim 1, wherein the duty error correction signal generator comprises:
   a differential amplifier including N thermometer-coded transistors and adapted to output the differential control current signals after amplifying a difference between the second differential analog clock signals,
   wherein each 1 bit digital signal forming the N bit digital signal is input to each gate of the N transistors.

8. A duty cycle correction method, comprising:
   correcting duty cycles of first differential analog clock signals based on duty cycle correction signals and outputting second differential analog clock signals having corrected duty cycles;
   converting the second differential analog clock signals to differential digital clock signals;
   receiving the differential digital clock signals, detecting duty cycles of the received differential digital clock signals, and outputting a N bit digital signal based on a result of detection; and
   outputting differential control current signals having current gains controlled based on the second differential analog clock signals and the N bit digital signal as the duty cycle correction signals.

* * * * *